United States Patent
Wallis

(10) Patent No.: US 9,954,491 B2
(45) Date of Patent: Apr. 24, 2018

(54) SYSTEMS AND METHODS RELATED TO SWITCHABLE OUTPUT STAGES IN POWER AMPLIFIERS

(71) Applicant: SKYWORKS SOLUTIONS, INC., Woburn, MA (US)

(72) Inventor: Leslie Paul Wallis, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/722,061

(22) Filed: May 26, 2015

(65) Prior Publication Data

US 2016/0020732 A1 Jan. 21, 2016

Related U.S. Application Data

(60) Provisional application No. 62/004,139, filed on May 28, 2014.

(51) Int. Cl.
| | |
|---|---|
| *H04B 1/44* | (2006.01) |
| *H03F 1/02* | (2006.01) |
| *H03F 3/19* | (2006.01) |
| *H03F 3/24* | (2006.01) |
| *H03F 3/72* | (2006.01) |

(52) U.S. Cl.
CPC ............ *H03F 1/0277* (2013.01); *H03F 3/19* (2013.01); *H03F 3/245* (2013.01); *H03F 3/72* (2013.01); *H03F 2200/111* (2013.01); *H03F 2200/294* (2013.01); *H03F 2200/411* (2013.01); *H03F 2200/451* (2013.01); *H03F 2203/7209* (2013.01); *H03F 2203/7215* (2013.01)

(58) Field of Classification Search
CPC ....... H01Q 1/2291; H03F 1/0277; H03F 3/19; H03F 3/245; H03F 3/72; H03F 2200/111; H03F 2200/294; H03F 2200/411; H03F 2200/451; H03F 2203/7209; H03F 2203/7215
USPC ............................................... 455/82, 83, 78
See application file for complete search history.

(56) References Cited

U.S. PATENT DOCUMENTS

| | | | | |
|---|---|---|---|---|
| 6,721,544 | B1 * | 4/2004 | Franca-Neto | H04B 1/52 333/172 |
| 7,155,267 | B2 * | 12/2006 | Lee | H04B 1/005 343/751 |
| 7,702,278 | B2 * | 4/2010 | Onomatsu | H04B 7/0814 343/751 |
| 8,351,849 | B2 * | 1/2013 | Ying | H04B 1/406 343/729 |
| 8,560,028 | B1 * | 10/2013 | Mulbrook | H01Q 1/28 343/702 |

(Continued)

*Primary Examiner* — Golam Sorowar
*Assistant Examiner* — Max Mathew
(74) *Attorney, Agent, or Firm* — Chang & Hale LLP

(57) ABSTRACT

Systems and method related to switchable output stages in power amplifiers. In some embodiments, a power amplifier (PA) circuit can include a driver stage configured to amplify a radio-frequency (RF) signal. The PA circuit can further include a plurality of output stages, with each output stage being configured to be capable of further amplification the RF signal. The PA circuit can further include a switch implemented to route the amplified RF signal from the driver stage to a selected one of the plurality of output stages, such that the selected output stage further amplifies the amplified RF signal.

7 Claims, 10 Drawing Sheets

(56) References Cited

U.S. PATENT DOCUMENTS

| | | | | |
|---|---|---|---|---|
| 8,594,584 B2* | 11/2013 | Greene | .............. | H04B 1/0458 333/17.3 |
| 8,781,522 B2* | 7/2014 | Tran | .............. | H01Q 1/22 343/745 |
| 8,942,644 B2* | 1/2015 | Schell | .............. | H04B 1/0064 361/13 |
| 2008/0136512 A1* | 6/2008 | Dow | .............. | H03F 1/0205 330/51 |
| 2010/0079194 A1* | 4/2010 | Zheng | .............. | H03K 17/08122 327/427 |
| 2012/0274402 A1* | 11/2012 | Kocon | .............. | H01L 29/402 330/277 |
| 2013/0337754 A1* | 12/2013 | Khlat | .............. | H01P 1/15 455/78 |
| 2014/0105079 A1* | 4/2014 | Bengtsson | .............. | H04B 1/005 370/297 |
| 2014/0227982 A1* | 8/2014 | Granger-Jones | .............. | H04B 7/0404 455/77 |
| 2014/0376417 A1* | 12/2014 | Khlat | .............. | H04B 1/0064 370/277 |
| 2015/0171815 A1* | 6/2015 | Maxim | .............. | H03G 3/3042 455/127.2 |
| 2015/0230186 A1* | 8/2015 | Chiou | .............. | H04W 52/146 455/522 |
| 2015/0349731 A1* | 12/2015 | Kwon | .............. | H03F 1/565 330/252 |
| 2015/0355653 A1* | 12/2015 | Drebinger | .............. | G05F 1/575 323/280 |
| 2016/0134016 A1* | 5/2016 | Hsu | .............. | H01Q 1/243 343/853 |

* cited by examiner

SYSTEMS AND METHODS RELATED TO SWITCHABLE OUTPUT STAGES IN POWER AMPLIFIERS

CROSS-REFERENCE TO RELATED APPLICATION(S)

This application claims priority to U.S. Provisional Application No. 62/004,139 filed May 28, 2014, entitled SYSTEMS AND METHODS RELATED TO SWITCHABLE OUTPUT STAGES IN POWER AMPLIFIERS, the disclosure of which is hereby expressly incorporated by reference herein in its entirety.

BACKGROUND

Field

The present disclosure generally relates to switchable output stages in radio-frequency (RF) power amplifiers.

Description of the Related Art

In wireless communication applications, a radio-frequency (RF) signal to be transmitted is typically generated by a transceiver. Such an RF signal is typically amplified by a power amplifier (PA) before being routed to an antenna.

SUMMARY

According to some implementations, the present disclosure relates to a power amplifier (PA) circuit that includes a driver stage configured to amplify a radio-frequency (RF) signal, and a plurality of output stages, with each output stage being configured to be capable of further amplification the RF signal. The PA circuit further includes a switch implemented to route the amplified RF signal from the driver stage to a selected one of the plurality of output stages, such that the selected output stage further amplifies the amplified RF signal.

In some embodiments, the switch can include an input pole and a plurality of output throws corresponding to the plurality of output stages. The plurality of output stages can include a first output stage and a second output stage. The switch can include a plurality of switching elements, with each switching element having one side connected to the input pole, and the other side connected to the corresponding throw.

In some embodiments, each of the plurality of output stages can be configured to be capable of being connected to a corresponding antenna. The corresponding antenna can be unique to each output stage.

In a number of implementations, the present disclosure relates to a front-end architecture for a wireless device. The front-end architecture includes a power amplifier (PA) configured to amplify a radio-frequency (RF) signal for transmission. The PA includes a driver stage and a plurality of output stages. The front-end architecture further includes an RF switch configured to route a partially amplified RF signal from the driver stage to a selected one of the plurality of output stages, such that the selected output stage further amplifies the partially amplified RF signal. The front-end architecture further includes a plurality of antennas including a selected antenna coupled to the selected output stage to facilitate transmission of the amplified RF signal through the selected antenna.

In some embodiments, the front-end architecture can further include a switching network configured to route the amplified RF signal from the selected output stage to the selected antenna. The front-end architecture can further include a low-noise antenna (LNA) configured to receive and amplify a received RF signal from an antenna among the plurality of antennas. The switching network can be further configured to route the received RF signal from the antenna to the LNA. The front-end architecture can be configured to operate in a time-division duplexing (TDD) mode.

In some embodiments, the PA can be part of a transmit (Tx) circuit. The Tx circuit can include a Tx switch implemented between an output of the corresponding output stage and the corresponding antenna. In some embodiments, the PA may not be coupled to a receive (Rx) circuit so that a Tx switch is absent between an output of the corresponding output stage and the corresponding antenna.

In some embodiments, the RF switch can include an input pole coupled to the driver stage, a first throw coupled to a first output stage, and a second throw coupled to a second output stage. The switching network can include a first Tx switch between the first output stage and a first antenna, a second Tx switch between the second output stage and a second antenna, a first Rx switch between the first antenna and the LNA, and a second Rx switch between the second antenna and the LNA. Each of the first Rx switch and the second Rx switch can be in an OFF state during a transmit portion of the TDD operation. A selected one of the first Tx switch and the second Tx switch can be in an ON state and the other Tx switch can be in an OFF state during the transmit portion, with the selected Tx switch corresponding to the selected output stage.

In some embodiments, each of the first Tx switch and the second Tx switch can be in an OFF state during a receive portion of the TDD operation. A selected one of the first Rx switch and the second Rx switch can be in an ON state and the other Rx switch can be in an OFF state during the receive portion, with the selected Rx switch corresponding to the antenna providing the RF signal to the LNA.

In some embodiments, each of the first Tx switch, the second Tx switch, the first Rx switch, and the second Rx switch can include one or more field-effect transistors (FETs) connected in series. The number of FETs in each of the first Rx switch and the second Rx switch can be greater than the number of FET(s) in each of the first Tx switch and the second Tx switch.

In some embodiments, the switching network can include a first Tx switch between the first output stage and a first antenna, a second Tx switch between the second output stage and a second antenna, a first switchable shunt path between the first antenna and a ground, and a second switchable shunt path between the second antenna and the ground. Each of the first switchable shunt path and the second switchable shunt path can include a quarter-wave transmission line. The front-end architecture can further include a shunt switch configured to switchably connect the first switchable shunt path and the second switchable shunt path to the ground.

According to some teachings, the present disclosure relates to a method for operating a radio-frequency (RF) system. The method includes amplifying a radio-frequency (RF) signal in a driver stage of a power amplifier. The method further includes routing the RF signal from the driver stage to a selected one of a plurality of output stages, such that the selected output stage further amplifies the RF signal. The method further includes routing the RF signal for transmission from the selected output stage to a selected one of a plurality of antennas.

In some implementations, the present disclosure relates to a radio-frequency (RF) module that includes a packaging substrate configured to receive a plurality of components, and a power amplifier (PA) circuit implemented on the packaging substrate. The PA circuit is configured to amplify an RF signal for transmission, and includes a driver stage and a plurality of output stages. The RF module further includes an RF switch implemented on the packaging substrate. The RF switch is configured to route a partially amplified RF signal from the driver stage to a selected one of the plurality of output stages, such that the selected output stage further amplifies the partially amplified RF signal. The RF module further includes a plurality of antenna ports having a selected antenna port that is coupled to the selected output stage to allow routing of the amplified RF signal to a selected antenna.

In some embodiments, the PA circuit can be implemented on a first die and the RF switch can be implemented on a second die. In some embodiments, the PA circuit and the RF switch can be implemented on a common die.

In accordance with some implementations, the present disclosure relates to a wireless device that includes a transceiver configured to process radio-frequency (RF) signals, and a plurality of antennas configured to be capable of being coupled to the transceiver. The wireless device further includes a front-end module (FEM) in communication with the transceiver and the plurality of antennas. The FEM includes a power amplifier (PA) circuit configured to amplify an RF signal for transmission. The PA circuit includes a driver stage and a plurality of output stages. The FEM further includes an RF switch configured to route a partially amplified RF signal from the driver stage to a selected one of the plurality of output stages such that the selected output stage further amplifies the partially amplified RF signal. The FEM further includes a plurality of antenna ports corresponding to the plurality of output stages such that the amplified RF signal from the selected output stage is allowed to be routed to a selected one of the plurality of antennas. In some embodiments, the transceiver can be configured to operate in a time-division duplexing (TDD) mode.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are various examples of how power amplifier systems can be configured to provide advantageous features such as reduced loss.

Figure 1A:
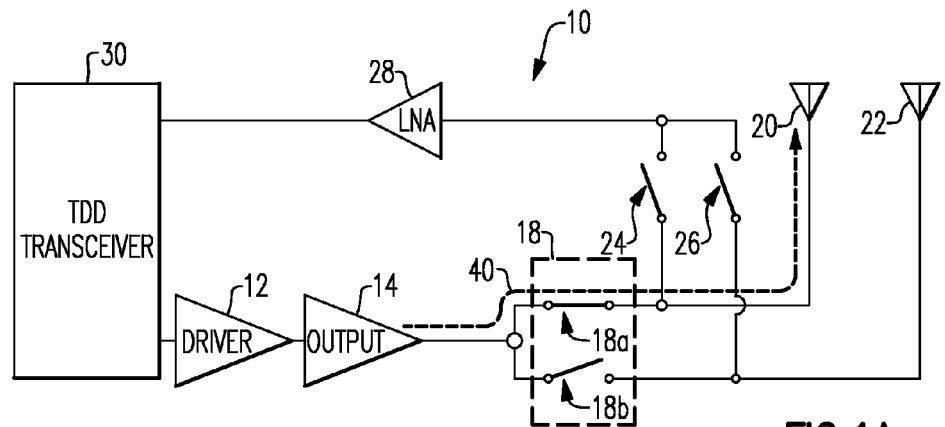
FIGS. 1A-1C show an example radio-frequency (RF) system where a switching network can route an amplified RF signal to one of two antennas, as well as route a received signal from one of the two antennas for processing.
Figure 1B:
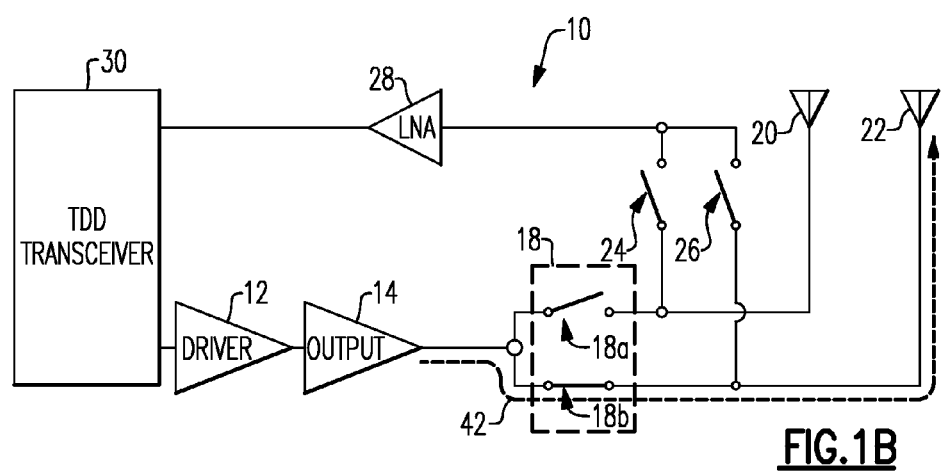
Figure 1C:
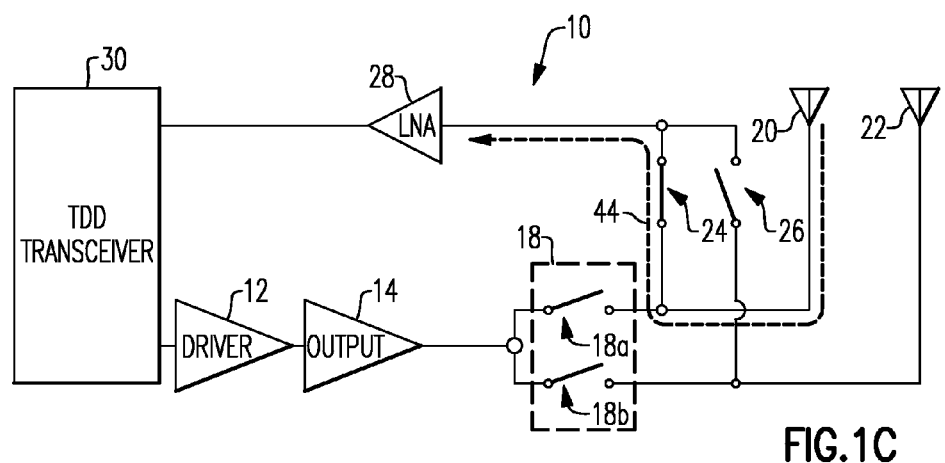

In antenna diversity applications involving a plurality of antennas, an output of a power amplifier (PA) is typically routed to a selected antenna. For example, such a PA output can be routed to one of two antennas. In some applications, such routing of an amplified radio-frequency (RF) signal is performed by an RF switch. FIGS. 1A-1C show an RF system 10 where an RF switch 18 performs routing of an amplified RF signal to one of two antennas 20, 22. The RF switch 18 can be implemented as two separate switch elements 18a, 18b as shown, and such switch elements can be operated to provide desired routing of signals in the RF system 10. The amplified RF signal is shown to be provided by a PA that can include a driver stage 12 and an output stage 14. The PA can receive an RF signal to be amplified from a transceiver 30.

In some embodiments, the transceiver 30 can be configured to operate in a time-division duplexing (TDD) mode, where transmission and reception operations are performed in an alternating manner typically through alternating switching operation. Examples of such TDD operations are described herein in greater detail. Although described in the context of TDD examples, it will be understood that one or more features of the present disclosure can also be implemented in other types of RF systems, including those utilizing frequency-division duplexing (FDD) modes.

In FIGS. 1A-1C, the transceiver 30 is shown to receive a received signal that has been amplified by a low-noise amplifier (LNA) 28. The LNA 28 can be coupled to either of the antennas 20, 22 through a corresponding receive (Rx) switch (24 or 26).

In FIG. 1A, the RF system 10 is shown to be in a transmit mode where an amplified RF signal from the output stage 14 is routed to the first antenna 20. To facilitate such a transmission operation, both of the Rx switches 24, 26 are opened. The RF switch 18 is shown to be in a state where the input pole is connected to the output stage 14, and a first output throw is in communication with the first antenna 20. Such a switching configuration can be achieved by closing the switch element 18a and opening the switch element 18b. Accordingly, the amplified RF signal follows a transmission path depicted as 40.

In FIG. 1B, the RF system 10 is shown to be in another transmit mode where an amplified RF signal from the output stage 14 is routed to the second antenna 22. To facilitate such a transmission operation, both of the Rx switches 24, 26 are opened, similar to the example of FIG. 1A. The RF switch 18, however, is shown to be in a state where the input pole is connected to the output stage 14, and a second output throw is in communication with the second antenna 22. Such a switching configuration can be achieved by opening the switch element 18a and closing the switch element 18b. Accordingly, the amplified RF signal follows a transmission path depicted as 42.

In FIG. 1C, the RF system 10 is shown to be in a receive mode where a received RF signal from the first antenna 20 is routed to the LNA 28. To facilitate such a receive operation, each of the RF switch 18, and the second Rx switch 26 is opened, and the first Rx switch 24 is closed. For the RF switch 18, each of the two switch elements 18a, 18b can be opened. Accordingly, the received RF signal follows a reception path depicted as 44. It will be understood that reception through the second antenna 22 can be achieved in a similar manner.

In RF systems such as the example shown in FIGS. 1A-1C, a loss associated with the RF switch (18) can be significant. For example, a switch loss in a range of about 0.7 dB to 1 dB can be expected. When it is desired or required to deliver a given power at a selected antenna, such a switch loss typically makes it necessary for the PA to output more power. For example, an increase in output power of a PA to overcome a switch loss of 1 dB can translate to an increase in the PA's supply current by about 25%. Such an increase in the supply current can have undesirable effects, including, for example, reduced battery life in portable wireless devices.

Figure 2A:
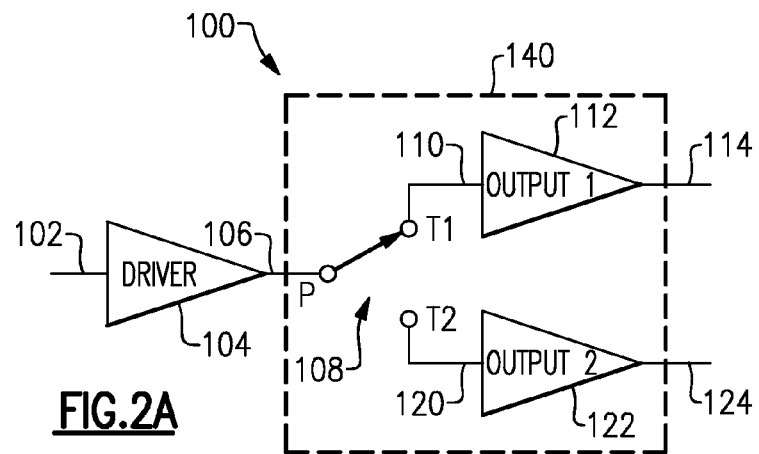
FIG. 2A shows an example power amplifier (PA) circuit having an output stage for each of a plurality of transmission paths, with the output stages switchably coupled to a common driver stage.

In some embodiments, switching functionality for routing transmission RF signals to different antennas can be implemented prior to an output stage of a PA. FIG. 2A shows an example PA circuit 100 having an output stage for each of a plurality of transmission paths. Such output stages can be switchably coupled to an output of a common driver stage. For example, a driver stage 104 is shown to receive an RF signal through an input path 102. The output of the driver stage 104 is shown to be connected to a pole (P) of an RF switch 108 through path 106. Such a switch can be, for example, a single-pole-double-throw (SPDT) switch, with the first throw (T1) being connected to an input of a first output stage 112 (through path 110), and the second throw (T2) being connected to an input of a second output stage 122 (through path 120). The output of the first output stage 112 can be routed (through path 114) to a first antenna (not shown in FIG. 2A) as described herein. Similarly, the output of the second output stage 122 can be routed (through path 124) to a second antenna (not shown in FIG. 2A) as described herein. In FIG. 2A, the switchable output stages are collectively indicated as 140.

Figure 2B:
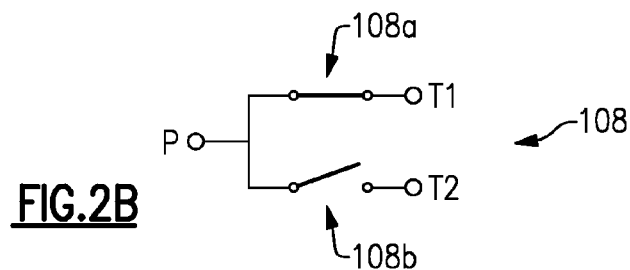
FIG. 2B shows an example of how the switchable coupling of FIG. 2A can be implemented.

FIG. 2B shows an example of how the RF switch 108 of FIG. 2A can be implemented. Two separate switch elements 108a, 108b can be coupled to a common node (P) on one side, and the other side of each switch element can be coupled to its respective node (T1 or T2). In the example configuration shown in FIGS. 2A and 2B, the switch element 108a can be closed, and the switch element 108b can be opened, so as to connect the pole P to the first throw T1 to thereby route an RF signal through the first output stage 112. Similarly, to route an RF signal through the second output stage 122, the switch element 108b can be closed, and the switch element 108a can be opened, so as to connect the pole P to the second throw T2.

Figure 3A:
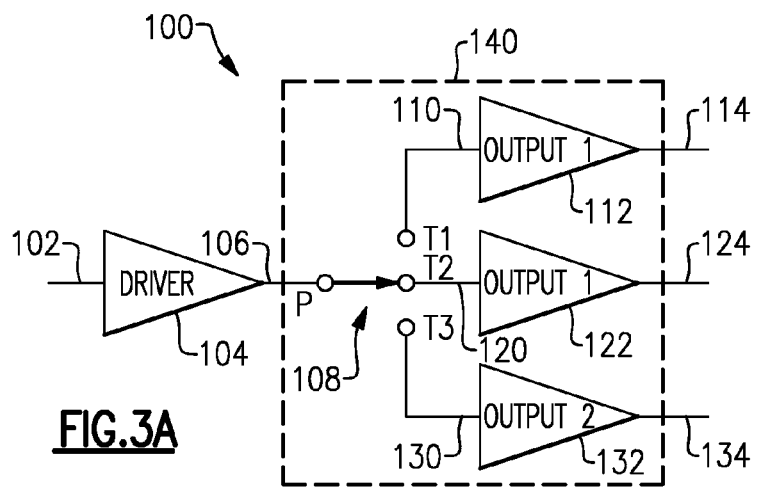
FIG. 3A shows a PA circuit having one or more features as described herein can include more than two output stages that are switchably coupled to a common driver stage.

Although various examples are described herein in the context of two output stages and corresponding antennas, it will be understood that one or more features of the present disclosure can also be implemented in PA circuits having more than two output stages. For example, FIG. 3A shows a PA circuit 100 where a third output stage 132 is implemented, such that its input is connected to a third throw of an RF switch 108 (e.g., a SP3T switch) through path 130, and its output is coupled to an antenna (not shown in FIG. 3A) through path 134. The first and second output stages 112, 122 can be configured similar to the example of FIG. 2A. In FIG. 3A, the switchable output stages are collectively indicated as 140.

Figure 3B:
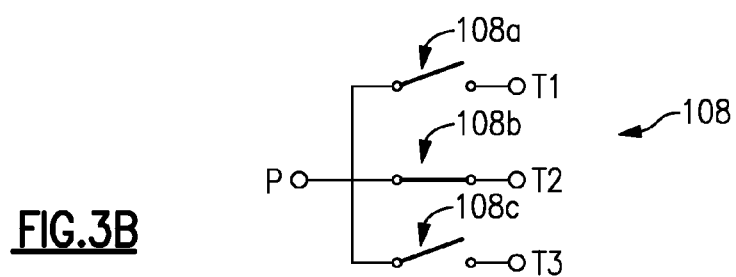
FIG. 3B shows an example of how the switchable coupling of FIG. 3A can be implemented.

FIG. 3B shows an example of how the RF switch 108 of FIG. 3A can be implemented. Three separate switch elements 108a, 108b, 108c can be coupled to a common node (P) on one side, and the other side of each switch element can be coupled to its respective node (T1, T2 or T3). In the example configuration shown in FIGS. 3A and 3B, the switch element 108a can be opened, the switch element 108b can be closed, and the switch element 108c can be opened, so as to connect the pole P to the second throw T2 to thereby route an RF signal through the second output stage 122. Similarly, to route an RF signal through the first output stage 112, the switch element 108a can be closed, and the switch elements 108b and 108c can be opened, so as to connect the pole P to the first throw T1. Similarly, to route an RF signal through the third output stage 132, the switch element 108c can be closed, and the switch elements 108a and 108b can be opened, so as to connect the pole P to the third throw T3.

In various examples, switches such as RF switches are depicted and described as SPDT or SPMT (multiple-throw) switches. It will be understood that such switches can be implemented in manners similar to the examples of FIGS. 2B and 3B.

It is noted that in the example of FIG. 1, the RF switch elements 18a, 18b need to block much higher power RF signals associated with the output stage 14. In the example context of MOS switches, such switches need to be constructed with many series devices to block the high peak RF voltages. In various configurations that utilize the configurations of FIGS. 2 and 3, the RF switch elements 108a, 108b, etc. only need to block much lower power RF signals (e.g., those from the driver stage 104). Such power blocking requirements can be determined by, for example, the receive signal levels and the TX level from the other active antenna due to coupling between the antennas. Such a configuration results in, for example, the switch elements 108a, 108b, etc. being able to be constructed with fewer series MOS devices. Such fewer series MOS devices in turn can result in a much lower loss for the switch element. In a receive mode, the signal level is typically very low; and accordingly, very few series devices are required in switches 108a, 108b, etc. Based on the foregoing, one can see that the TX selection switch 108 no longer needs to block very high RF power (and resulting peak voltages) associated with the output stages.

In some embodiments, each of the two output stages 112, 122 in the example of FIG. 2 can have its own output match network, thereby resulting in an additional output match network associated with the second output stage. However, such an additional output match network can be implemented with relatively low-cost passive devices.

In some embodiments, the additive cost of a second output stage (e.g., 122 in FIG. 2) can be much less than the cost associated with a high-power RF switch (e.g., 18 in FIG. 1) (e.g., a gallium arsenide (GaAs) switch) which is no longer needed. Even accounting for the RF switch 108 before the output stages, the cost associated with the second output stage is not necessarily higher than a counterpart example of FIG. 1.

Further, because of the reduced loss in the example of FIG. 2, the output stages can output less power (and thus be smaller), and can be operated at a lower gain. Accordingly, each output stage (112 or 122) in FIG. 2 can be implemented smaller than the output stage 14 in FIG. 1. Such reduced size in the output stages can offset at least some of the additional space needed for the second output stage 122.

Figure 4A:
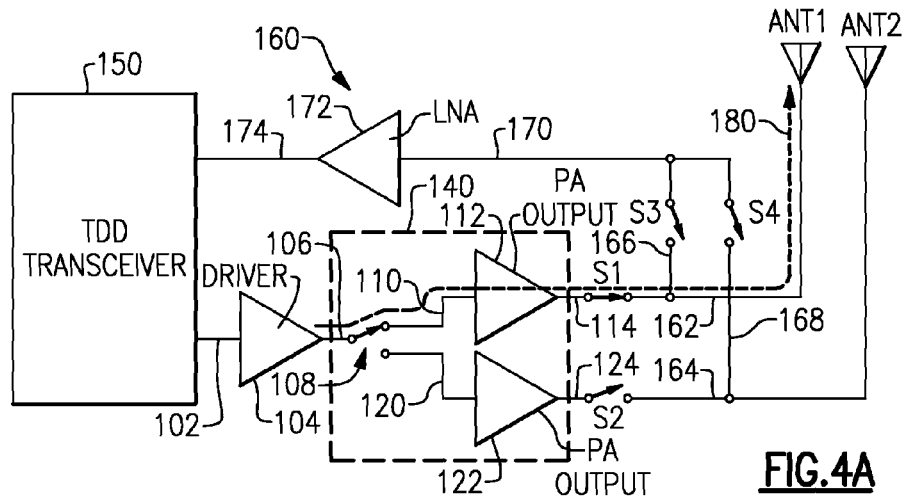
FIGS. 4A-4C show various operating modes of an example RF system that can include the PA circuit of FIG. 2A.
Figure 4B:
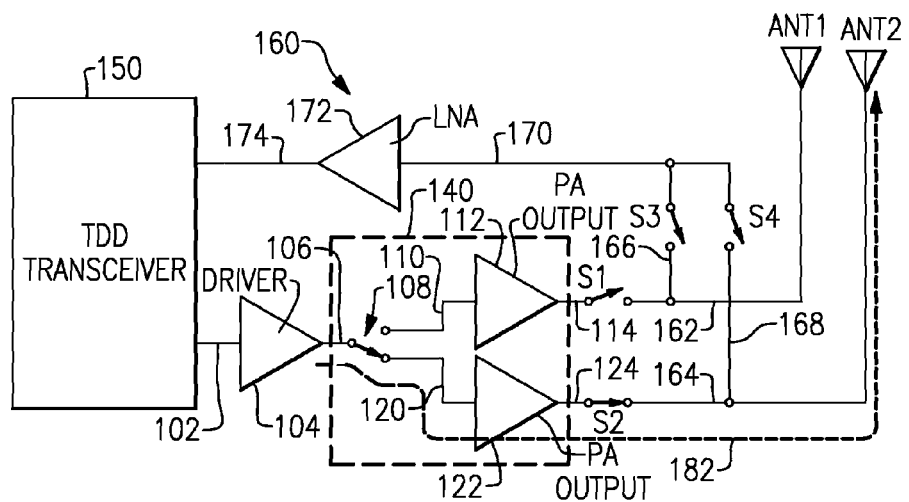
Figure 4C:
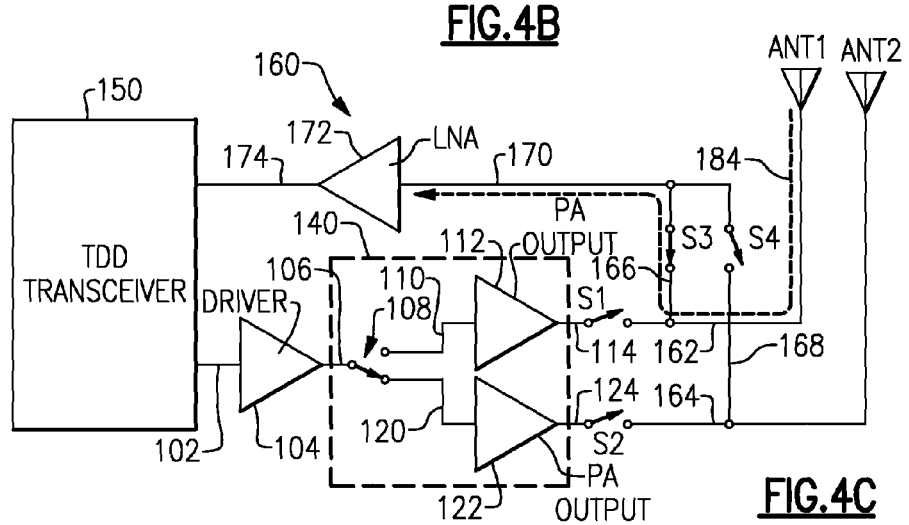

FIGS. 4A-4C show an example RF system 160 that includes the PA circuit 100 and its switchable output stages 140 as described in reference to FIG. 2. In FIGS. 4A-4C, an RF signal from a transceiver 150 is shown to be provided to a driver stage 104 of a PA circuit through path 102 to be partially amplified. The partially-amplified RF signal is shown to be provided to a pole of an RF switch 108 through path 106. The RF switch 108 can include a plurality of throws. For example, a single-pole-double-throw (SPDT) switch can be utilized. The first throw is shown to be connected to an input of a first output stage 112 through path 110 to fully amplify the partially-amplified signal, when the pole is connected to the first throw. Similarly, the second throw is shown to be connected to an input of a second output stage 122 through path 120 to fully amplify the partially-amplified signal, when the pole is connected to the second throw. In FIGS. 4A-4C, such switchable output stages are collectively indicated as 140.

The first output stage 112 is shown to be switchably coupled to a first antenna ANT1. For example, the first output stage 112 is shown to be connected to a first Tx switch S1 through path 114, and the first Tx switch S1 is shown to be connected to the first antenna ANT1 through path 162. Accordingly, the first output stage 112 can be connected to or disconnected from the first antenna ANT1 by having the first Tx switch S1 closed or opened, respectively.

Similarly, the second output stage 122 is shown to be switchably coupled to a second antenna ANT2. For example, the second output stage 122 is shown to be connected to a second Tx switch S2 through path 124, and the second Tx switch S2 is shown to be connected to the second antenna ANT2 through path 164. Accordingly, the second output stage 122 can be connected to or disconnected from the second antenna ANT2 by having the second Tx switch S2 closed or opened, respectively.

The transceiver 150 is shown to receive an amplified signal from an LNA 172 through path 174. The LNA 172 is shown to receive as input a received signal through path 170 from either the first antenna ANT1 or the second antenna ANT2. To receive a signal from the first antenna ANT1, a first Rx switch S3 in path 166 can be closed so as to connect the first antenna ANT1 to the input path 170. Similarly, to receive a signal from the second antenna ANT2, a second Rx switch S4 in path 168 can be closed so as to connect the second antenna ANT2 to the input path 170.

In FIG. 4A, the RF system 160 is shown to be in a transmit mode where an RF signal from the driver stage 104 is routed to the first antenna ANT1. To facilitate such a transmission operation, both of the Rx switches S3, S4 can be opened; the second Tx switch S2 can be opened; and the first Tx switch S1 can be closed. The RF switch 108 is shown to be in a state where the input pole is connected to the first throw and thereby to the first output stage 112. Accordingly, the partially-amplified RF signal from the driver stage 104 is shown to follow a transmission path depicted as 180, which includes the first output stage 112.

In FIG. 4B, the RF system 160 is shown to be in another transmit mode where an RF signal from the driver stage 104 is routed to the second antenna ANT2. To facilitate such a transmission operation, both of the Rx switches S3, S4 can be opened; the first Tx switch S1 can be opened; and the second Tx switch S2 can be closed. The RF switch 108 is shown to be in a state where the input pole is connected to the second throw and thereby to the second output stage 122. Accordingly, the partially-amplified RF signal from the driver stage 104 is shown to follow a transmission path depicted as 182, which includes the second output stage 122.

In FIG. 4C, the RF system 160 is shown to be in a receive mode where a received signal from the first antenna ANT1 is routed to the LNA 172. To facilitate such a receive operation, the first Rx switch S3 can be closed; the second Rx switch S4 can be opened; and both of the Tx switches S1, S2 can be opened. Accordingly, the received signal from the first antenna ANT1 is shown to follow a reception path depicted as 184. It will be understood that reception through the second antenna ANT2 can be achieved in a similar manner.

Figure 5A:
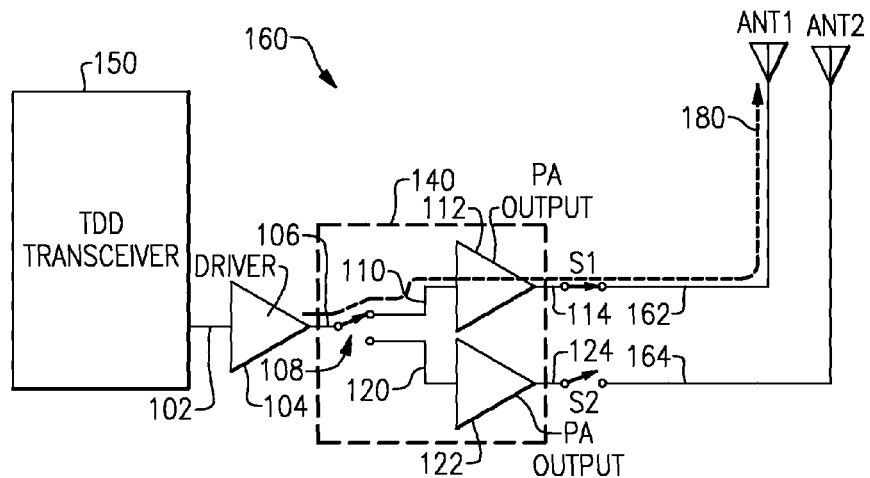
FIGS. 5A and 5B show that an example RF system that can be similar to the example of FIGS. 4A and 4B, but without a receive path.
Figure 5B:
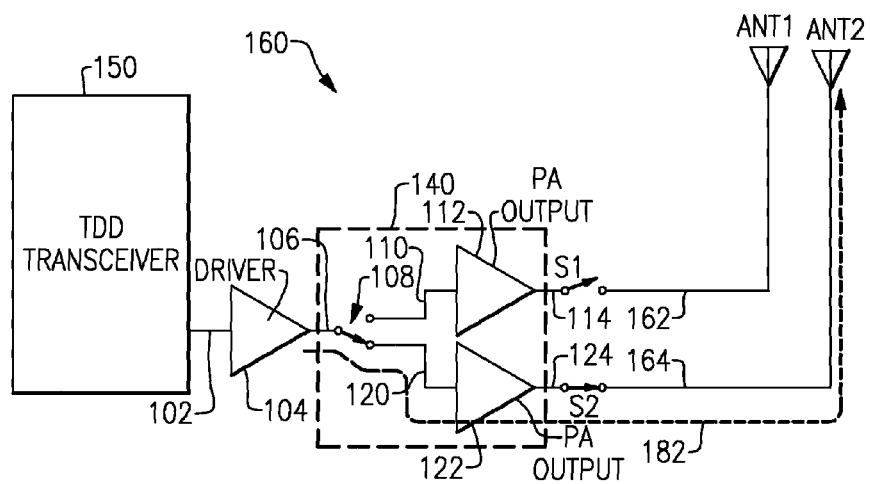

FIGS. 5A and 5B show an RF system 160 that can be similar to the example of FIGS. 4A and 4B, but without a receive path. More particularly, in the example of FIGS. 5A and 5B, the Rx paths 166, 168 and related components (e.g., S3, S4, LNA) of FIGS. 4A and 4B are absent. Such a configuration can be implemented in, for example, non-TDD applications where a receive path is not needed or desired. Such a configuration can also facilitate antenna diversity for Tx operations.

In FIG. 5A, the RF system 160 is shown to be in a transmit mode where an RF signal from the driver stage 104 is routed to the first antenna ANT1. To facilitate such a transmission operation, the second Tx switch S2 can be opened; and the first Tx switch S1 can be closed. The RF switch 108 is shown to be in a state where the input pole is connected to the first throw and thereby to the first output stage 112. Accordingly, the partially-amplified RF signal from the driver stage 104 is shown to follow a transmission path depicted as 180, which includes the first output stage 112.

In FIG. 5B, the RF system 160 is shown to be in another transmit mode where an RF signal from the driver stage 104 is routed to the second antenna ANT2. To facilitate such a transmission operation, the first Tx switch S1 can be opened; and the second Tx switch S2 can be closed. The RF switch 108 is shown to be in a state where the input pole is connected to the second throw and thereby to the second output stage 122. Accordingly, the partially-amplified RF signal from the driver stage 104 is shown to follow a transmission path depicted as 182, which includes the second output stage 122.

In the example of FIGS. 5A and 5B, it is noted that the TX selection switch 108 can be configured as described herein in reference to FIGS. 2 and 3. It is further noted that the TX switches S1 and S2 can be omitted due to the absence of Rx path(s). In such a configuration, efficiency of the transmitter can be higher due to removal of loss associated with S1 and S2.

In the various examples described herein, it will be understood that some of all of the switches, including the switch 108 (e.g., FIGS. 2-5), can be implemented in, for example, MOS, GaAs or GaN process technologies. Other types of switches can also be utilized.

Figure 6:
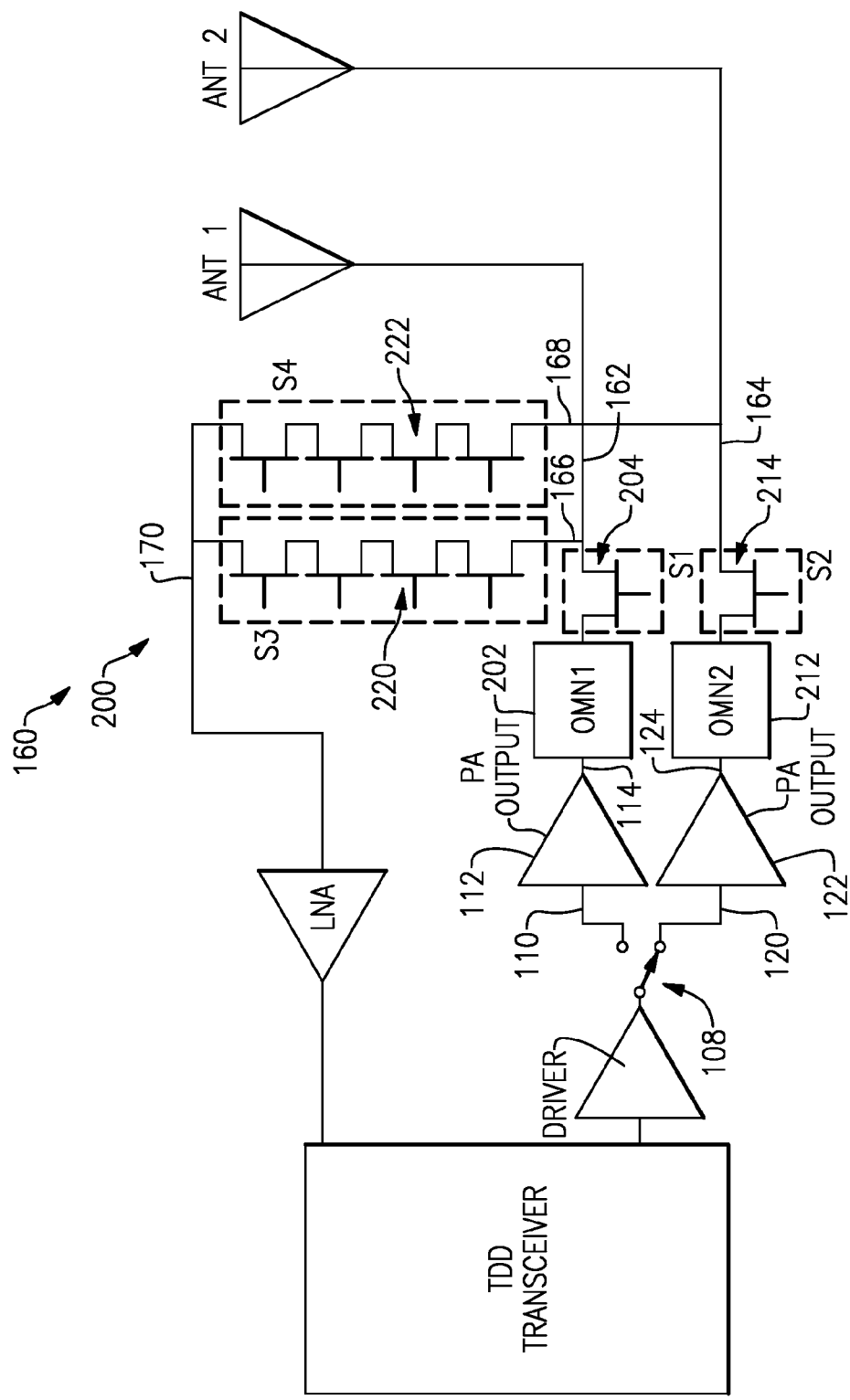
FIG. 6 shows an RF system that can be implemented as a more specific example of the RF system of FIGS. 4A-4C.

FIG. 6 shows an RF system 200 that can be implemented as a more specific example of the RF system 160 described in reference to FIGS. 4A-4C. For example, each throw of the RF switch 108 can include one or more (e.g., one or two) switching elements such as field-effect transistors (FETs) arranged in series as a stack (when more than one). Such low number of switching elements can be allowed due to, for example, the lower-powered RF signals being switched.

In another example, the path 114 between the first output stage 112 and the first Tx switch S1 can include a first output match network 202. Similarly, the path 124 between the second output stage 122 and the second Tx switch S2 can include a second output match network 212.

In yet another example, each of the first and second Tx switches S1, S2 can include one or more (e.g., one or two) switching elements such as FETs 204, 214 arranged in series as a stack (when more than one). As described herein in reference to FIGS. 5A and 5B, such Tx switches may or may not be present in configurations where Rx paths are not involved.

In yet another example, each of the first and second Rx switches S3, S4 can include N switching elements such as FETs 220, 222 arranged in series as a stack. The quantity N can be, for example 10. Such higher number of FETs in a stack can provide isolation between the LNA and the high power RF signals being transmitted.

Figure 7:
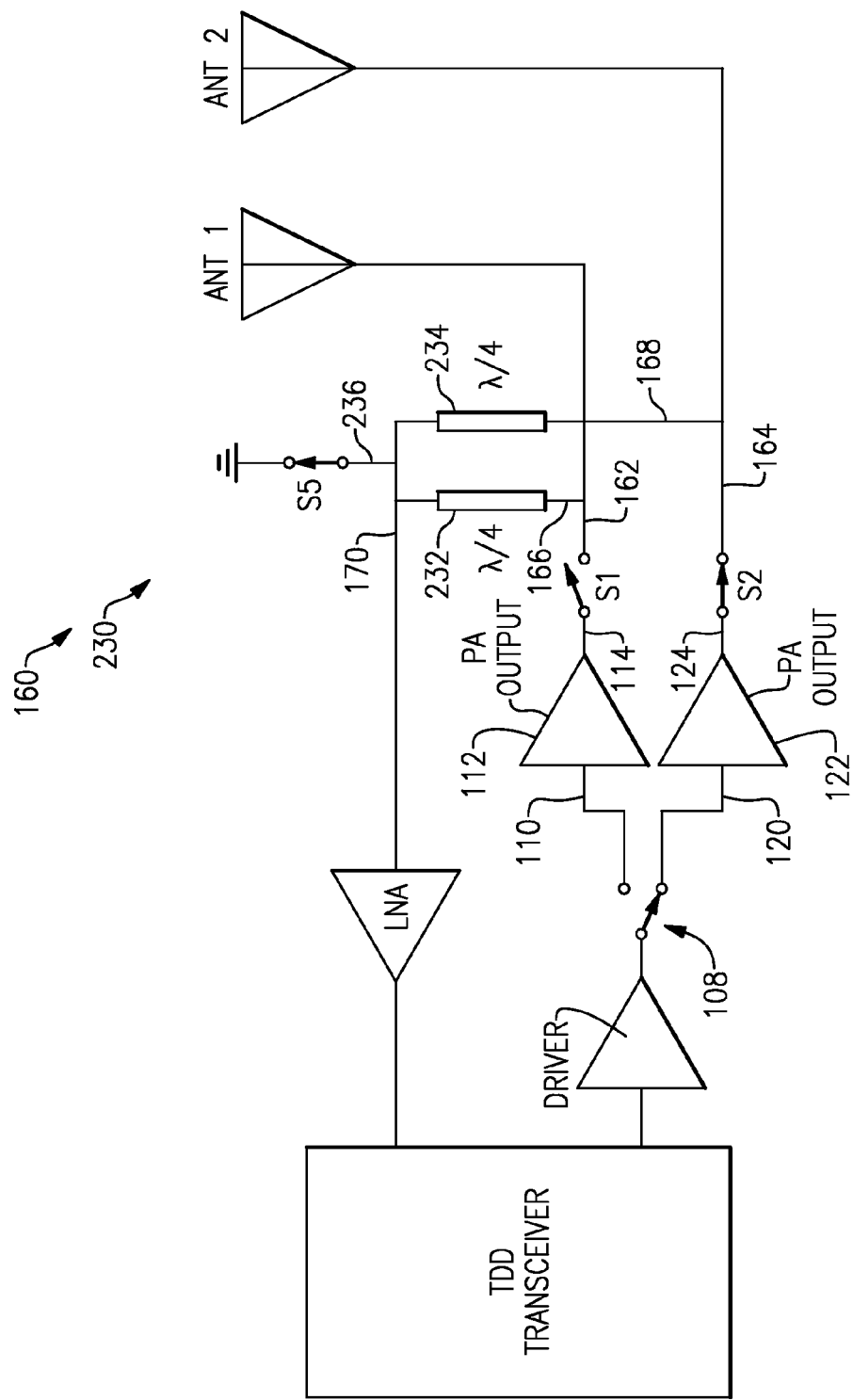
FIG. 7 shows that in some embodiments, at least some routing functionality can be provided without switches utilizing, for example, a quarter-wave line for each of a plurality of receive paths.

In the examples described in reference to FIGS. 4 and 6, the Rx switches S3, S4 can allow routing of signals being transmitted and received. FIG. 7 shows that in some embodiments, such routing functionality can be provided without the Rx switches in an RF system 230. For example, a quarter-wave ($\lambda$/4) line can be provided for each of the receive paths between their respective antennas and the input path to the LNA. In FIG. 7, the first receive path 166 is shown to include a quarter-wave line 232, and the second receive path 168 is shown to include a quarter-wave line 234. Such quarter-wave line can provide a shunt path 236 to ground when a shunt switch S5 is closed in a transmit state.

Figure 8:
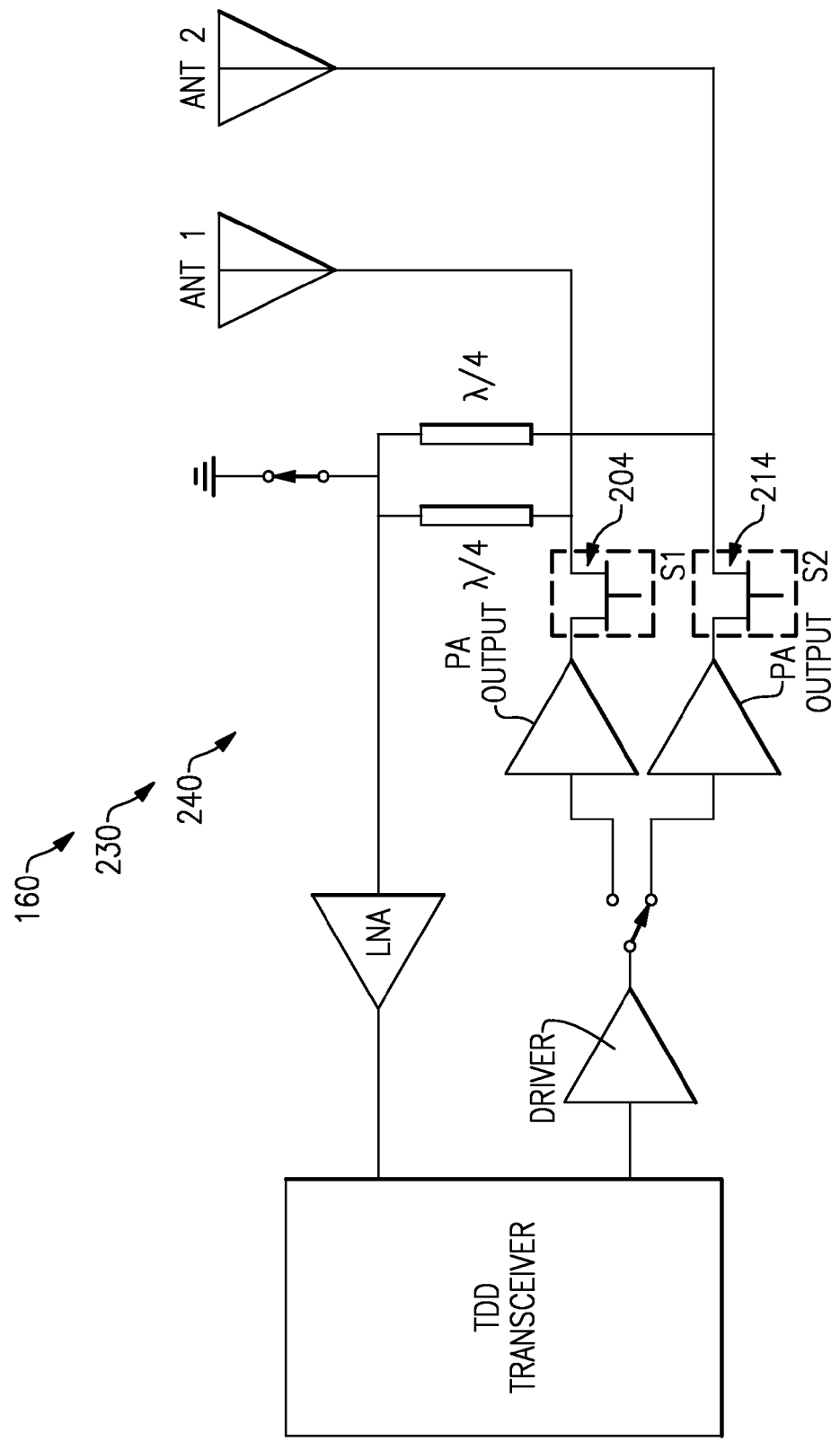
FIG. 8 shows an RF system that can be implemented as another more specific example of the RF system of FIG. 7.

FIG. 8 shows an RF system 240 that can be implemented as a more specific example of the RF system 230 described in reference to FIG. 7. For example, each throw of the RF switch 108 can include one or more (e.g., one or two) switching elements such as field-effect transistors (FETs) arranged in series as a stack (when more than one). In yet another example, each of the first and second Tx switches S1, S2 can include one or more (e.g., one or two) switching elements such as FETs (204, 214) arranged in series as a stack (when more than one).

Figure 9:
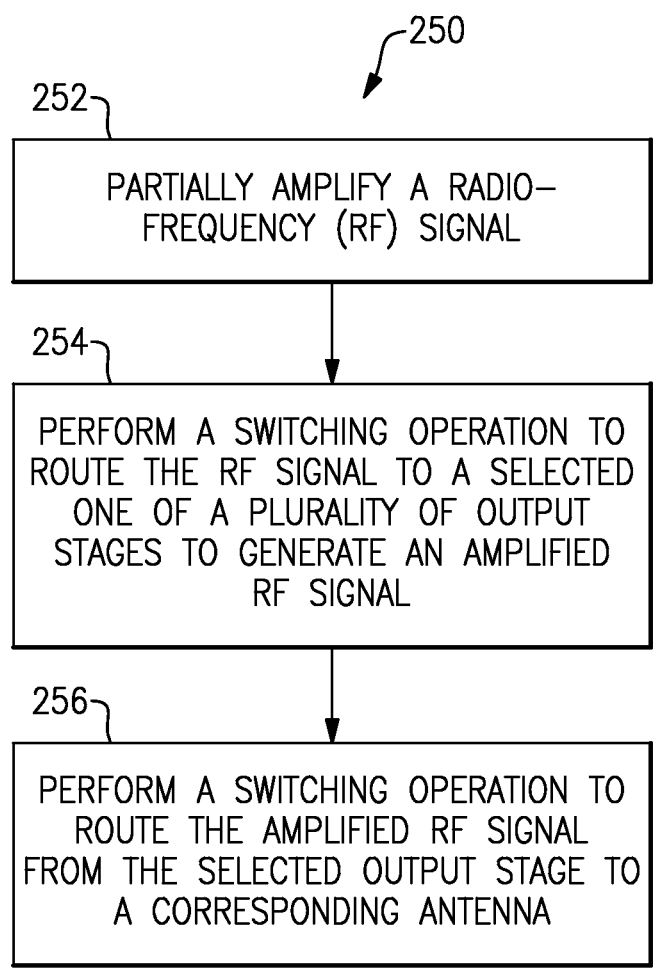
FIG. 9 shows a process that can be implemented to operate an RF system having one or more features as described herein.

FIG. 9 shows a process 250 that can be implemented to operate an RF system having one or more features as described herein. In block 252, an RF signal can be partially amplified by, for example, a driver stage of a PA circuit. In block 254, a switching operation can be performed to route the partially amplified RF signal to a selected one of a plurality of output stages of the PA circuit to generate an amplified RF signal. In block 256, a switching operation can be performed to route the amplified RF signal from the selected output stage to a corresponding antenna.

Figure 10:
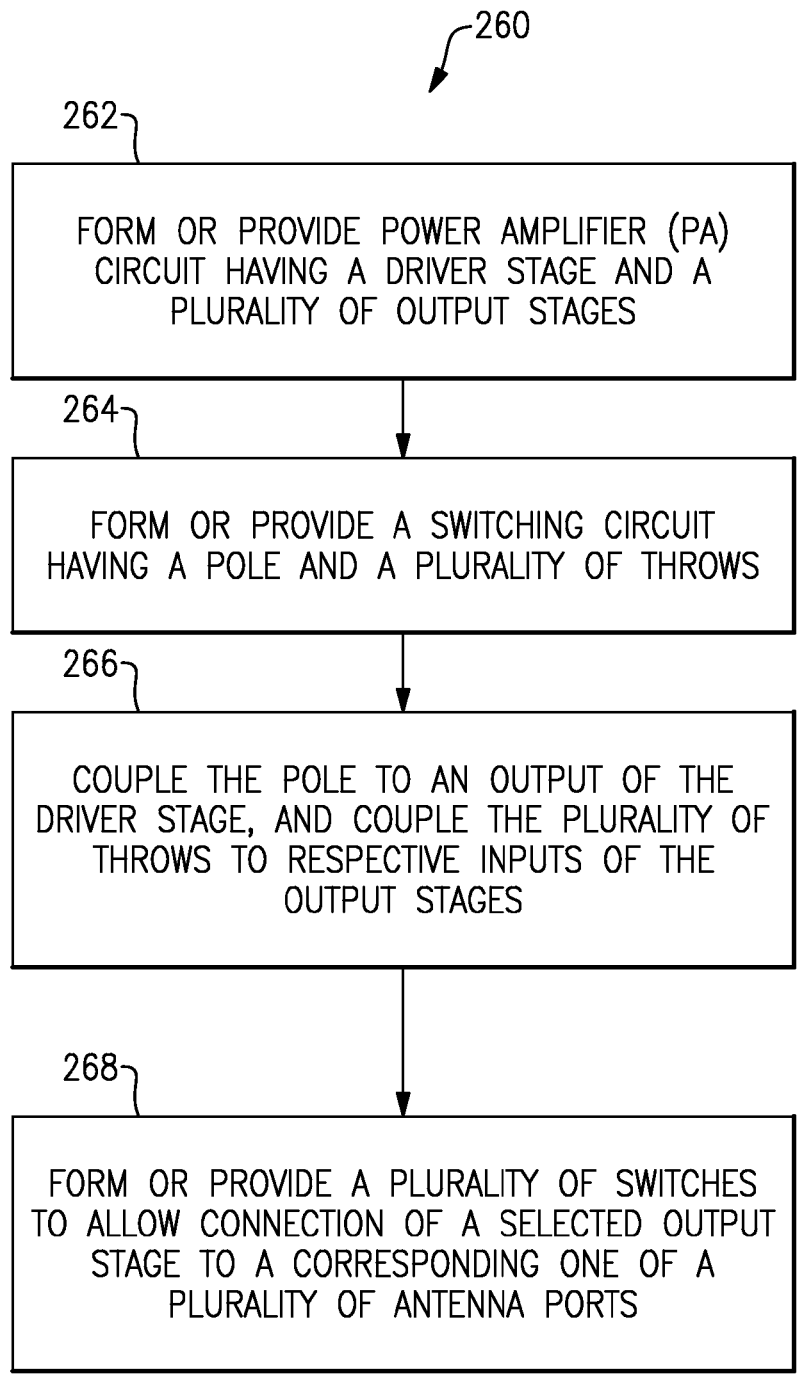
FIG. 10 shows a process that can be implemented to fabricate a device having one or more features as described herein.

FIG. 10 shows a process 260 that can be implemented to fabricate a device having one or more features as described herein. In block 262, a power amplifier (PA) circuit can be formed or provided, with the PA circuit including a driver stage and a plurality of output stages. In block 264, a switching circuit can be formed or provided, with the switching circuit including a pole and a plurality of throws. In block 266, the pole of the switching circuit can be coupled to the driver stage, and the plurality of throws can be coupled to their respective inputs of the output stages. In block 268, a plurality of switches can be formed or provided to allow connection of a selected output stage to a corresponding one of a plurality of antenna ports. Such antenna ports can be connected to their respective antennas.

Figure 11:
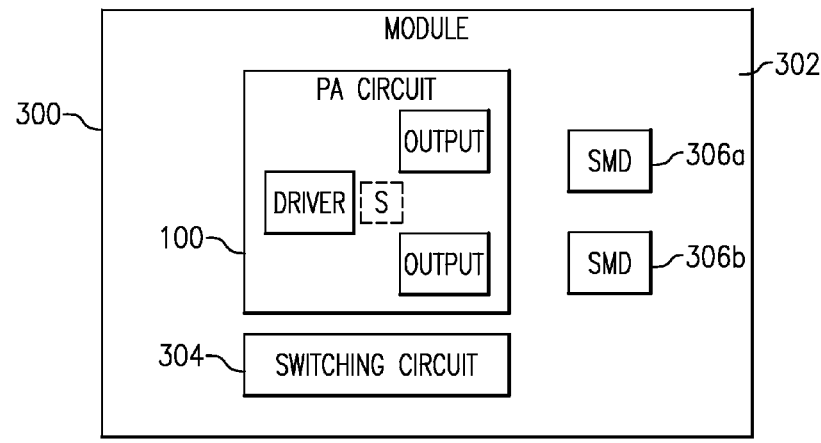
FIG. 11 shows that in some embodiments, one or more features of the present disclosure can be implemented in a product such as a module.

FIG. 11 shows that in some embodiments, one or more features of the present disclosure can be implemented in a product such as a module 300. Such a module can be, for example, a PA module. The module 300 can include a packaging substrate 302 configured to receive a plurality of components. One of such components can be a PA circuit 100 having one or more features as described herein. For example, the PA circuit 100 can include a driver stage and a plurality of output stages, and routing of RF signals from the driver stage to the output stages can be facilitated by an RF switch "S."

In some embodiments, the PA circuit 100 can be implemented on a single semiconductor die. The RF switch S may or may not be included in such a die.

Another component implemented on the packaging substrate can be a switching circuit 304. Such a switching circuit can include some or all of the various switches described herein. The switching circuit 304 may or may not be included in the same die as the PA circuit 100.

The module 300 can further include one or more surface-mount devices (SMDs) 306. Such SMDs can include, for example, passive components to facilitate various functionalities associated with the module 300. Although not shown in FIG. 11, the module 300 can further include, for example, various conductor features, ground plane(s), contact pads, and connection features (e.g., wirebonds or solder bumps) to facilitate various electrical connections, matching networks, etc.

In some implementations, device(s) and/or circuit(s) having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 12:
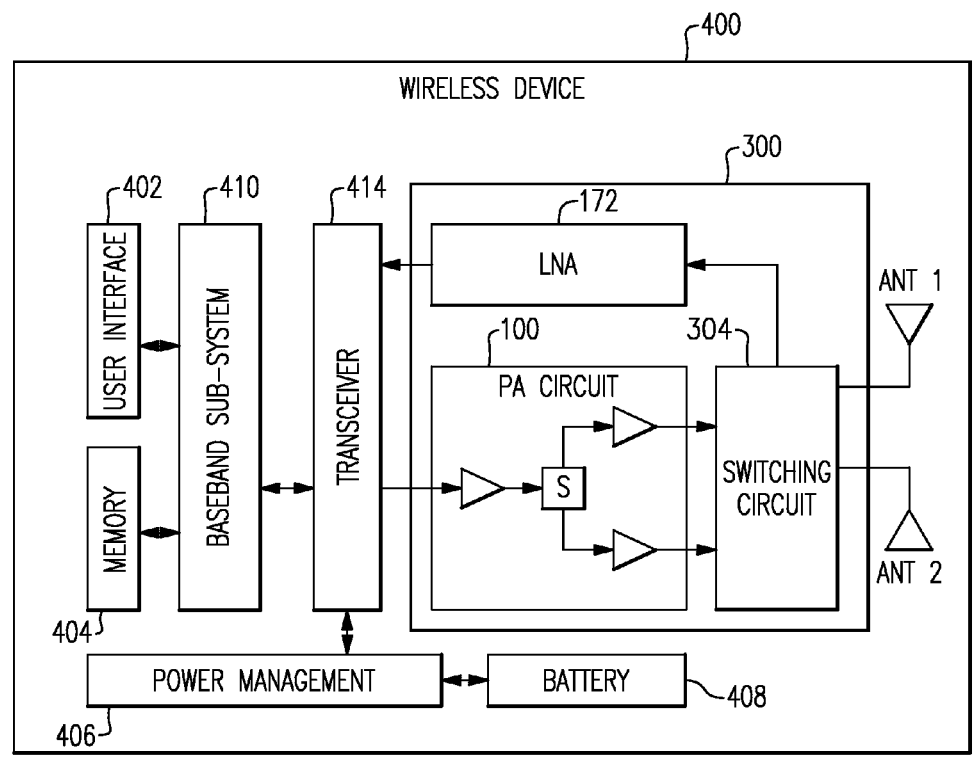
FIG. 12 depicts an example wireless device having one or more advantageous features described herein.

FIG. 12 depicts an example wireless device 400 having one or more advantageous features described herein. In the context of various power amplifier circuits and related switching functionalities as described herein, a power amplifier (PA) circuit 100 is shown to include a driver stage and a plurality of output stages. Routing of RF signals from the driver stage to the output stages can be achieved by an RF switch (S) as described herein. Such a PA circuit can be part of a module 300 as described herein. In some embodiments, the module 300 can be, for example, a front-end module (FEM), and the FEM can include a switching circuit having one or more features as described herein. The FEM 300 can also include an LNA 172. As described herein, duplexing of transmission and reception can be achieved through the module 300 in a time-division duplexing (TDD) mode.

In the example wireless device 400, the PA circuit 100 can route RF signals to a plurality of antennas (e.g., ANT1 and ANT2) through the plurality of output stages as described herein. Some or all of such antennas can also be utilized for receiving of RF signals.

In the example wireless device 400, the PA circuit can receive an RF signal to be amplified from a transceiver 414. The transceiver 414 can also be configured to process received signals. Such received signals can be amplified by the LNA 172.

The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400. Such a power management component can also control operations of the baseband sub-system 410.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front-end architecture for a wireless device, comprising:
   a transmit circuit having a power amplifier configured to amplify a signal for transmission, the power amplifier including a driver stage and a plurality of output stages, the transmit circuit further including a switch configured to route a partially amplified signal from the driver stage to a selected one of the plurality of output stages, such that the selected output stage further amplifies the partially amplified signal, the switch including an input pole coupled to the driver stage, a first throw coupled to a first output stage and a second throw coupled to a second output stage;
   a plurality of antennas including a selected antenna coupled to the selected output stage through a switching network to facilitate transmission of the amplified signal through the selected antenna, the switching network including a first transmit switch between the first output stage and a first antenna, a second transmit switch between the second output stage and a second antenna; and
   a low-noise amplifier configured to amplify a received signal from an antenna among the plurality of antennas, the switching network further configured to route the received signal from the antenna to the low-noise amplifier, the switching network further including a first receive switch between the first antenna and the low-noise amplifier, and a second receive switch between the second antenna and the low-noise amplifier, the front-end architecture configured to operate in a time-division duplexing mode such that each of the first receive switch and the second receive switch is in an OFF state during a transmit portion of the time-division duplexing operation, and a selected one of the first transmit switch and the second transmit switch is in an ON state and the other transmit switch is in an OFF state during the transmit portion, the selected transmit switch corresponding to the selected output stage.

2. The front-end architecture of claim 1 wherein each of the first transmit switch and the second transmit switch is in an OFF state during a receive portion of the time-division duplexing operation.

3. The front-end architecture of claim 2 wherein a selected one of the first receive switch and the second receive switch is in an ON state and the other receive switch is in an OFF state during the receive portion, the selected receive switch corresponding to the antenna providing the received signal to the low-noise amplifier.

4. The front-end architecture of claim 1 wherein each of the first transmit switch, the second transmit switch, the first receive switch, and the second receive switch includes one or more field-effect transistors connected in series.

5. The front-end architecture of claim 4 wherein the number of field-effect transistors in each of the first receive switch and the second receive switch is greater than the number of field-effect transistor(s) in each of the first transmit switch and the second transmit switch.

6. The front-end architecture of claim 1 wherein the switching network further includes a first switchable shunt path between the first antenna and a ground, and a second switchable shunt path between the second antenna and the ground.

7. The front-end architecture of claim 6 wherein each of the first switchable shunt path and the second switchable shunt path includes a quarter-wave transmission line.

* * * * *